(12) United States Patent
Savla et al.

(10) Patent No.: US 8,098,101 B2
(45) Date of Patent: Jan. 17, 2012

(54) METHOD OF ACHIEVING HIGH SELECTIVITY IN RECEIVER RF FRONT-ENDS

(75) Inventors: Anup Savla, San Mateo, CA (US); Roger Brockenbrough, Los Gatos, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/169,559

(22) Filed: Jul. 8, 2008

(65) Prior Publication Data

US 2010/0007424 A1   Jan. 14, 2010

(51) Int. Cl.
*H03F 3/04* (2006.01)
(52) U.S. Cl. .................. 330/305; 330/253; 330/254
(58) Field of Classification Search .................. 330/305, 330/253, 254
See application file for complete search history.

(56) References Cited

U.S. PATENT DOCUMENTS

| | | | |
|---|---|---|---|
| 3,986,152 A | 10/1976 | Howell | |
| 4,419,638 A | 12/1983 | Johnson | |
| 4,518,930 A | 5/1985 | Rozema et al. | |
| 5,703,912 A * | 12/1997 | Wang et al. | 375/354 |
| 6,150,881 A * | 11/2000 | Lovelace et al. | 330/252 |
| 6,750,727 B1 * | 6/2004 | Sutardja | 331/117 R |
| 6,985,035 B1 | 1/2006 | Khorramabadi | |
| 7,202,740 B2 * | 4/2007 | Leete | 330/254 |
| 7,259,625 B2 * | 8/2007 | Sanderson | 330/253 |
| 7,415,286 B2 * | 8/2008 | Behzad | 455/553.1 |
| 2007/0139112 A1 | 6/2007 | Bocock et al. | |
| 2008/0032661 A1 | 2/2008 | Ojo et al. | |
| 2008/0204148 A1 * | 8/2008 | Kim et al. | 330/306 |

FOREIGN PATENT DOCUMENTS

WO   WO2008027933   3/2008

OTHER PUBLICATIONS

International Search Report and Written Opinion—PCT/US2009/049976, International Search Authority— European Patent Office—Jan. 19, 2010.
Invitation To Pay Additional Fees—PCT/US2009/049976, International Search Authority—European Patent Office—Oct. 15, 2009.

* cited by examiner

*Primary Examiner* — Patricia Nguyen
(74) *Attorney, Agent, or Firm* — Ramin Mobarhan

(57) ABSTRACT

According to some embodiments, an apparatus may comprise an amplifier, wherein the amplifier comprises: an output stage formed of a positive output terminal providing a positive output voltage and a negative output terminal providing a negative output voltage; a load tank coupled in parallel with the output stage and configured to filter signals received at the amplifier; and a negative resistance block coupled in parallel with the output stage and the load tank.

27 Claims, 11 Drawing Sheets

METHOD OF ACHIEVING HIGH SELECTIVITY IN RECEIVER RF FRONT-ENDS

FIELD OF DISCLOSURE

The present disclosure relates generally to circuits, and more specifically to improving selectivity of receiver front-ends suitable for wireless communication and other applications.

BACKGROUND

In low-power, wireless receiver design, a major challenge is presented by the presence of strong (i.e., relatively high amplitude) blockers or interferers operating at frequencies similar to that of a desired signal. For example, a global positioning system (GPS) receiver operating at approximately 1575 MHz may receive significant interference from a CDMA wireless communication system operating around 1700 MHz. These blockers can impact the design of several significant aspects of a receiver, e.g., linearity, local oscillator (LO) phase noise, mismatch tolerance, power consumption, etc. For zero-intermediate-frequency (IF) and low-IF transceiver designs, strong interference signals close in frequency to the desired signal can mix with the noise sidebands of a LO to produce unwanted noise products that can degrade the receiver's performance, a phenomenon known as reciprocal mixing.

The portion of a wireless receiver used for conversion of received radio frequency (RF) signals to the appropriate IF signals is referred to as an RF front-end. RF front-ends typically include low noise amplifiers (LNAs), mixers and often an additional controllable gain or transconductance stage.

FIG. 1 illustrates an example conventional RF front-end circuit. As shown, RF front-end circuit 10 includes an LNA 12, a transconductance (gm) stage 14, and LO stage 16. RF front-end circuit 10 receives RF signals at LNA 12 from an external matching circuit 5, the external matching circuit being formed of various capacitors and inductors to provide some rejection of unwanted out-of-band RF signals. LNA 12 provides relatively low-noise amplification of the received RF signals and outputs amplified quadrature signals I and Q to gm stage 14. Gm stage 14 and LO stage 16 may include multiple transconductance devices and multiple mixer devices, respectively, for manipulating the quadrature signals I and Q to provide the appropriate IF signals.

Strong blockers and interferers are typically rejected in analog baseband circuitry of a receiver after downconversion. However, due to their proximity in frequency spectrum to the band of interest, there is usually no significant attenuation at RF frequencies. Therefore, although it is feasible to provide selectivity in the analog baseband circuitry and relax linearity and dynamic range requirements there, RF front-end linearity requirements and LO phase noise requirements still remain stringent.

One method of attenuating strong blockers in an RF front-end is to use an inductor-capacitor (LC) trap tuned to a single blocker frequency at the input or output of an LNA. This technique can mitigate the design challenges presented by a relatively high power blocker signal, either including or excluding the LNA depending on where the LC trap is placed. However, if used at the input of the LNA, the trap requires additional matching components and can significantly degrade the noise figure of the circuit, which is a conventional measure of degradation of the signal-to-noise-ratio (SNR) caused by components in the RF signal chain. To prevent noise figure degradation, the LC trap can be placed on-chip at the output of the LNA, but this makes it difficult to achieve a high quality factor (Q-factor, or simply 'Q') in the trap and obtain significant attenuation at nearby blocker frequencies. The Q-factor provides a comparison of the frequency at which a system oscillates to the rate at which it dissipates energy. A higher Q therefore indicates a lower rate of energy dissipation relative to the oscillation frequency, so the oscillations die out more slowly, making a high-Q desirable for narrowband applications such as the LC trap described above. However, even if high-Q on-chip inductors are feasible, they are usually prohibitively large.

To achieve high-Q on-chip inductance without using a large die area, gyrator-based active inductor circuits are often used. These gyrator circuits are used to simulate an inductive element in an integrated circuit (IC) using active devices which typically require less die space than actual inductors. There are several well-known examples of modified gyrators which can be used to somewhat control the Q-factor of a circuit, thereby achieving an arbitrarily sharp attenuation profile at a given blocker frequency. However, the noise response of such active circuits is usually more broadband, especially the noise response generated due to inverse frequency noise upconversion. This additional noise leads to significant degradation of the noise figure in the desired signal band.

Another approach to providing selectivity in RF front-ends takes advantage of tank circuits (or load tanks) sometimes used in differential LNAs.

FIG. 2 illustrates a conventional differential LNA having a load tank. As shown, LNA 200 includes an input (or transconductance) stage 210, a current buffer stage 220, a load tank 230, and a tail current source 260. The input stage 210 includes first and second transconductance devices 212 and 214 (e.g., NMOS transistors). Current buffer stage 220 includes a pair of cascode transistors 222 and 224 (e.g., NMOS transistors). Load tank 230 is formed of a tank inductor 232 and tank capacitor 234. Load tank 230 also includes a resistance Rtank 236, which may be a physical resistor or may simply represent the real impedance of the other elements in load tank 230. In addition to the load tank resistance Rtank 236, the output resistance of LNA 200 is illustrated as Rout-LNA 270, and the input resistance of the next stage fed by LNA 200 (e.g., transconductance stage 14 of FIG. 1) is illustrated as Rin-next 240 in FIG. 2.

Input stage 210 is configured to receive RF signals from external matching circuit 5, as described above with reference to FIG. 1. Tail current source stage 260 is configured to provide current to input stage 210, and may be implemented in a variety of ways as is well-known in the art. LNA 200 is DC biased by a biasing voltage VDD, and cascode devices 222 and 224 are biased by a cascode biasing voltage Vcasc. As shown, an output signal is generated at an output stage 280 by providing a positive output voltage Vout+ at an upper terminal (i.e., load tank side) of cascode device 222, and providing a negative output voltage Vout− at a corresponding upper terminal of the other cascode device 224. Elements or representations of elements coupled in parallel with output stage 280 (i.e., across the positive and negative outputs Vout+ and Vout− of LNA 200) are considered part of the 'output network' of LNA 200.

Load tank 230 enables LNA 200 to provide a tuned frequency response, thereby rejecting to a certain degree out-of-band signals. However, the amount of selectivity achieved with this approach is typically limited by the finite Q of the elements at the output network of LNA 200. Specifically, the Q-factor of LNA 200 is dependent on the equivalent real part impedance Req-LNA of the output network, where Req-LNA can be determined as follows:

$$\text{Req-LNA} = \text{Rtank} \| \text{Rout-LNA} \| \text{Rin-next}. \quad (1)$$

Thus, in theory, a high-Q can be achieved by keeping the equivalent resistance Req-LNA high. However, in typical process technologies, even with the use of high-Q capacitors and inductors with a relatively low load tank resistance Rtank 236, it is difficult to get an equivalent Q of 8 or more from such a network, and out-of-band blocker rejection is therefore limited to only a few decibels (dBs).

SUMMARY

Exemplary embodiments of the invention are directed to circuits, systems, and methods for improving selectivity of receiver front-ends suitable for wireless communication and other applications.

Accordingly, an embodiment can include an apparatus comprising an amplifier, wherein the amplifier comprises: an output stage formed of a positive output terminal providing a positive output voltage and a negative output terminal providing a negative output voltage; a load tank coupled in parallel with the output stage and configured to filter signals received at the amplifier; and a negative resistance block coupled in parallel with the output stage and the load tank.

Another embodiment can include a method of amplifying a signal, the method comprising: receiving an input signal at an input stage; providing an output signal, including a positive output voltage at a positive output terminal and a negative output voltage at a negative output terminal, in response to the input signal; filtering the input signal at the positive and negative output terminals; and providing a negative resistance between the positive and negative output terminals.

Another embodiment can include an amplifier, comprising: means for receiving an input signal; means for providing an output signal, including a positive output voltage at a positive output terminal and a negative output voltage at a negative output terminal, in response to the input signal; means for filtering the input signal at the positive and negative output terminals; and means for providing a negative resistance between the positive and negative output terminals.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
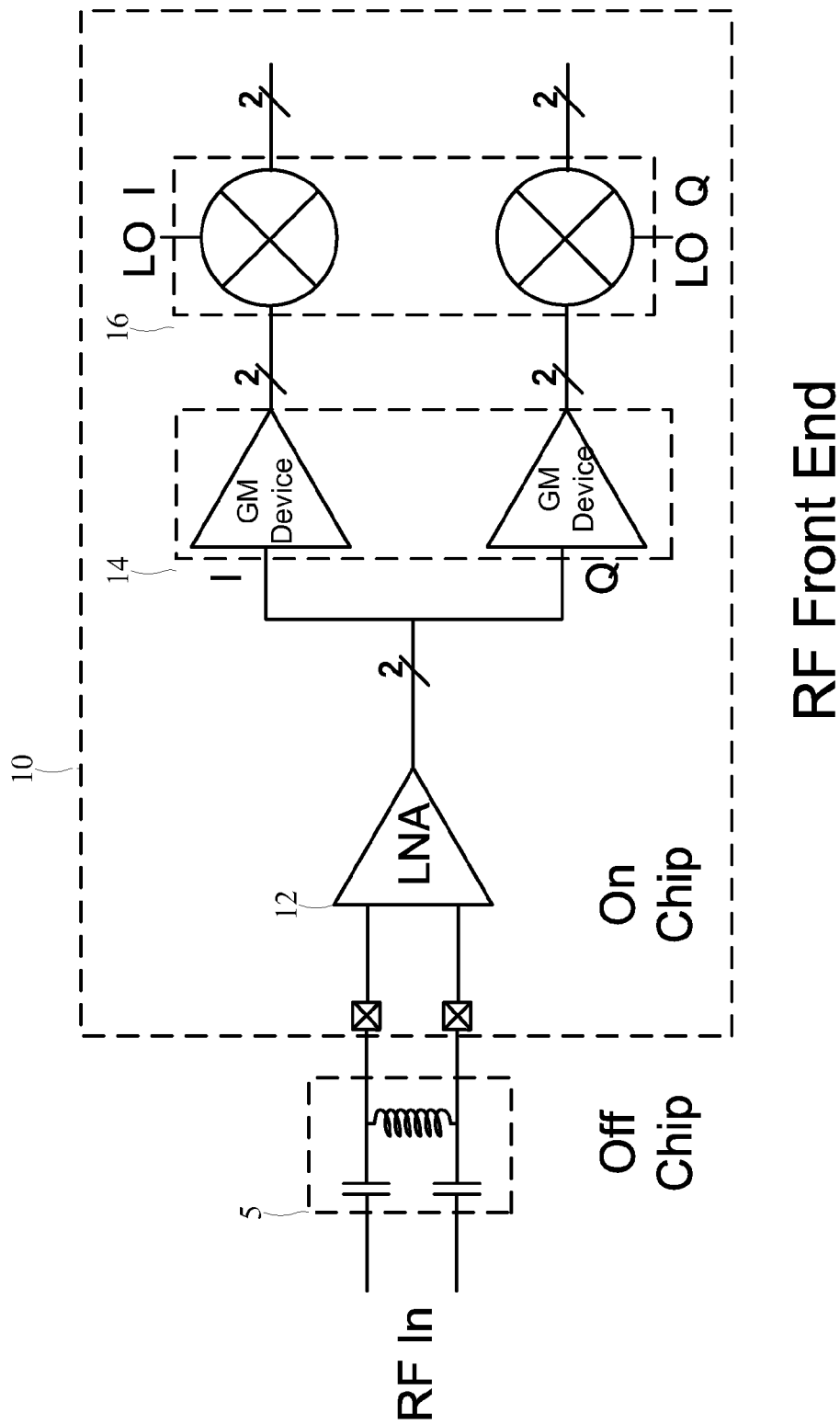
FIG. 1 illustrates an example conventional RF front-end circuit.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As discussed above in the background, the amount of selectivity achieved in a conventional differential LNA is typically limited by the finite Q of the load tank, output impedance, and next stage input impedance seen at its output network. Although in theory a high-Q can be achieved by keeping the real part impedance of these elements relatively low, leading to a relatively high output network equivalent resistance Req-LNA, in practice, this yields relatively little improvement in Q. In contrast, embodiments of the invention provide an additional negative resistance block at the output network to enhance Q by increasing Req-LNA. For example, by adding a negative resistance block with a resistance of −Rneg to the output network, an equivalent resistance Req according to embodiments of the invention can be determined as follows:

$$Req = Rtank || Rout\text{-}LNA || Rin\text{-}next || \text{-}Rneg \quad (2)$$

$$= Req\text{-}LNA || \text{-}Rneg$$

$$= \frac{-R_{eq\text{-}LNA} \cdot R_{neg}}{R_{eq\text{-}LNA} - R_{neg}}$$

$$= \frac{R_{eq\text{-}LNA}}{1 - \frac{R_{eq\text{-}LNA}}{R_{neg}}}.$$

As can be seen from equation (2), the equivalent resistance of the LNA can be arbitrarily increased by a factor of 1/(1−Req-LNA/Rneg), leading to an arbitrarily high-Q. As long as Rneg is kept higher than Req-LNA, Req will be positive and the system will be stable. Accordingly, a higher positive equivalent real part impedance Req-LNA can be achieved, increasing the Q of the output response to a desired level, and hence, improving the selectivity of a receiver RF front-end.

Figure 3:
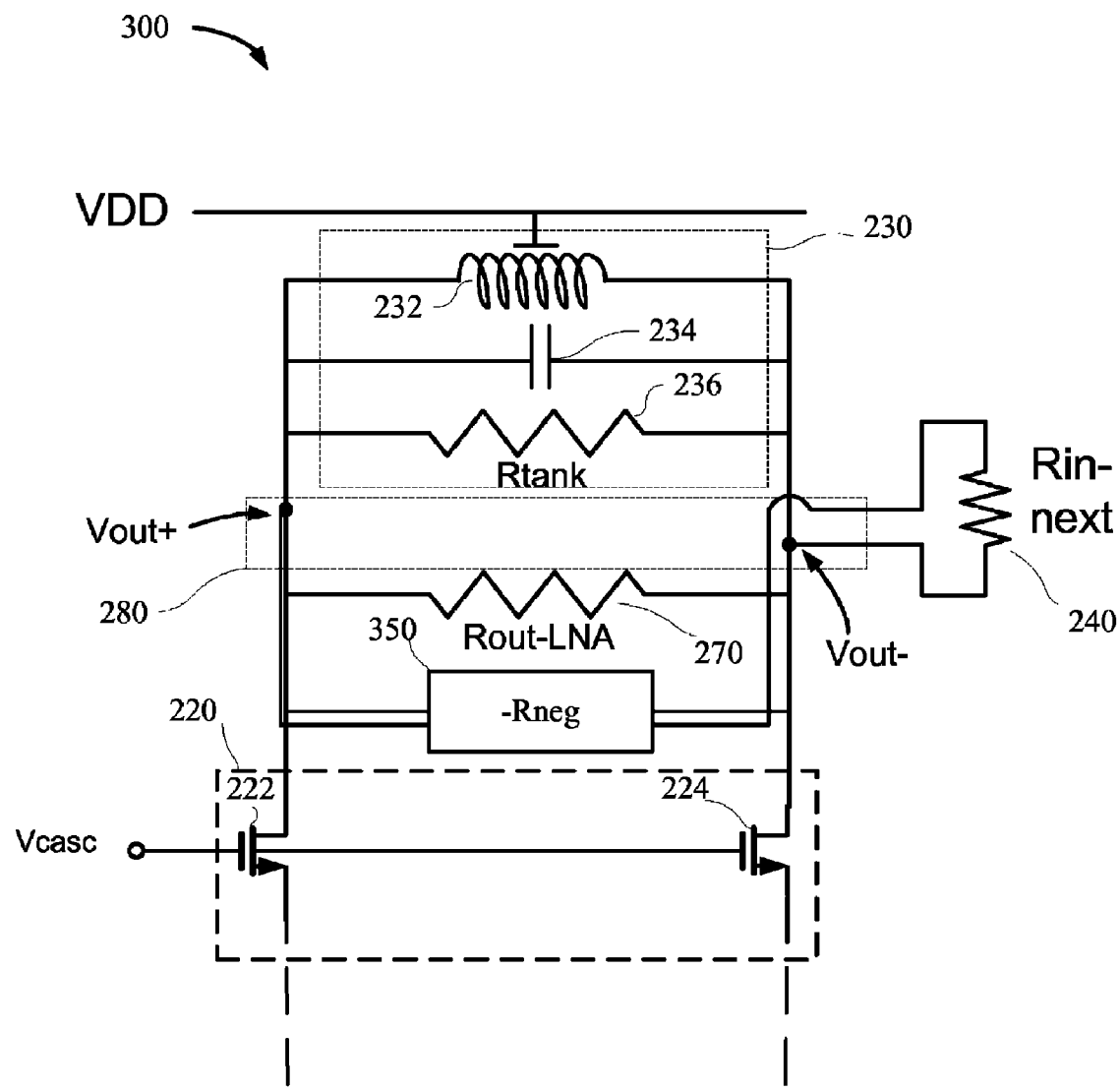
FIG. 3 illustrates the output network of an LNA with added negative resistance according to various embodiments of the invention.

FIG. 3 illustrates the output network of an LNA 300 with added negative resistance according to various embodiments of the invention.

As shown, similar to LNA 200, LNA 300 includes a current buffer stage 220 and a load tank 230. Current buffer stage 220 includes a pair of cascode transistors 222 and 224 (e.g., NMOS transistors). Load tank 230 is formed of a tank inductor 232 and tank capacitor 234. Load tank 230 also includes a resistance Rtank 236, which may be an actual resistor or may simply represent the real impedance of the other elements in load tank 230. In addition to the load tank resistance Rtank 236, the output resistance of LNA 200 is illustrated as Rout-LNA 270, and the input resistance of the next stage fed by LNA 200 (e.g., transconductance stage 14 of FIG. 1) is illustrated as Rin-next 240 in FIG. 3.

Figure 2:
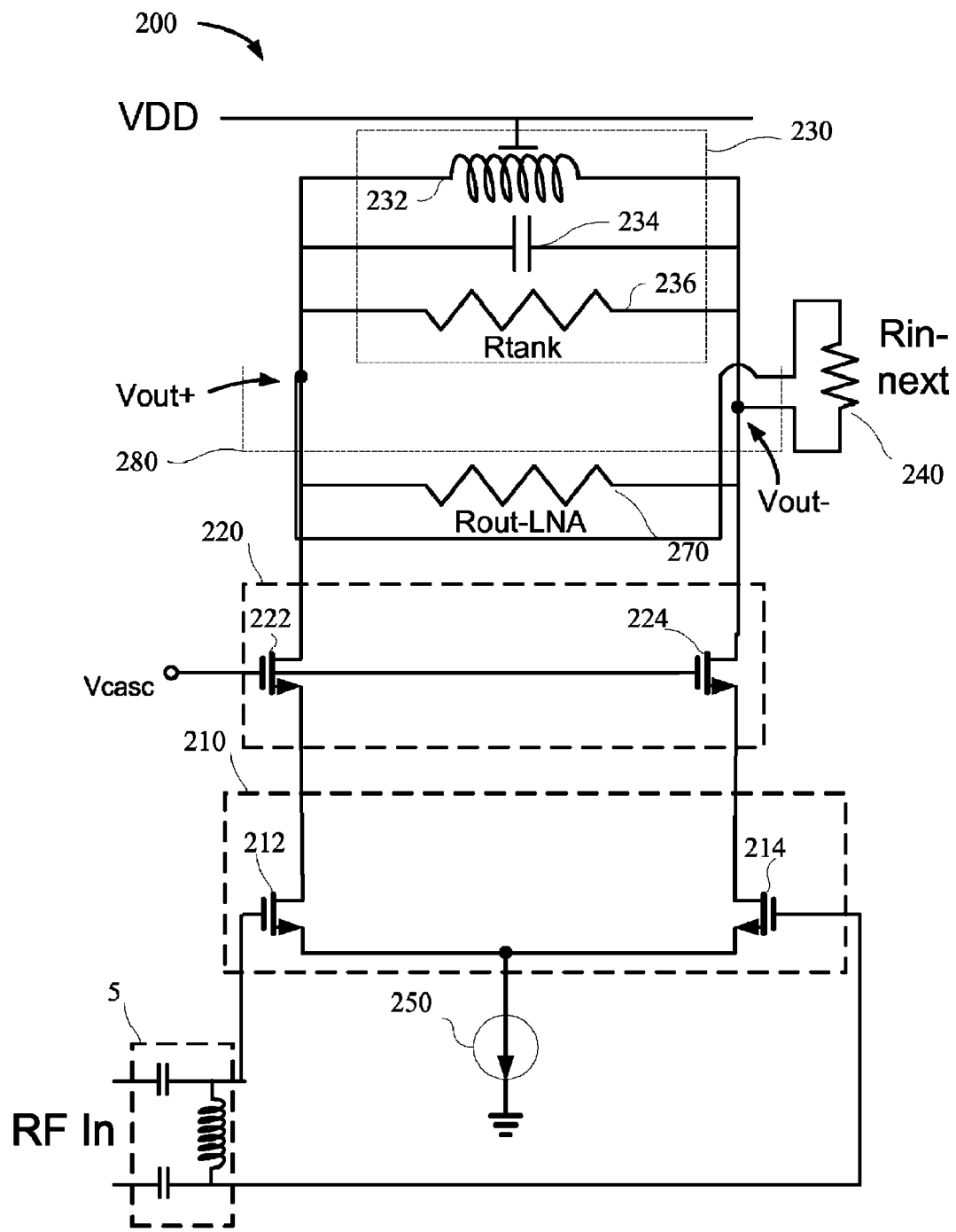
FIG. 2 illustrates a conventional differential LNA having a load tank.

LNA 300 is DC biased by a biasing voltage VDD, and cascode devices 222 and 224 are biased by a cascode biasing voltage Vcasc, similar to the biasing illustrated in FIG. 2. Also similar to the output signal of FIG. 2, as shown in FIG. 3, an output signal is generated at an output stage 280 by providing a positive output voltage Vout+ at an upper terminal (i.e., load tank side) of cascode device 222, and providing a negative output voltage Vout− at a corresponding upper terminal of the other cascode device 224. It will be appreciated that the remaining elements of LNA 200 not illustrated in FIG. 3 (e.g., input stage, tail current source, etc.) can be implemented substantially similar to the corresponding elements shown in FIG. 2.

LNA 300 further includes a negative resistance block 350 coupled in parallel with load tank 230 and output stage 280 (i.e., across the positive and negative outputs Vout+ and Vout−). As discussed above, negative resistance block 350 provides a negative resistance −Rneg to the output network of LNA 300 to increase the overall equivalent resistance Req.

It will be appreciated that negative resistance block 350 of FIG. 3 can be implemented in many ways. As will be described in more detail below, the following FIGS. 4-9 show various example designs of negative resistance block 350 according to various embodiments of the invention. It will be appreciated, however, that the example designs shown in FIGS. 4-9 are provided for illustration purposes only, and are not intended to represent an exhaustive list of possible implementations.

Figure 4:
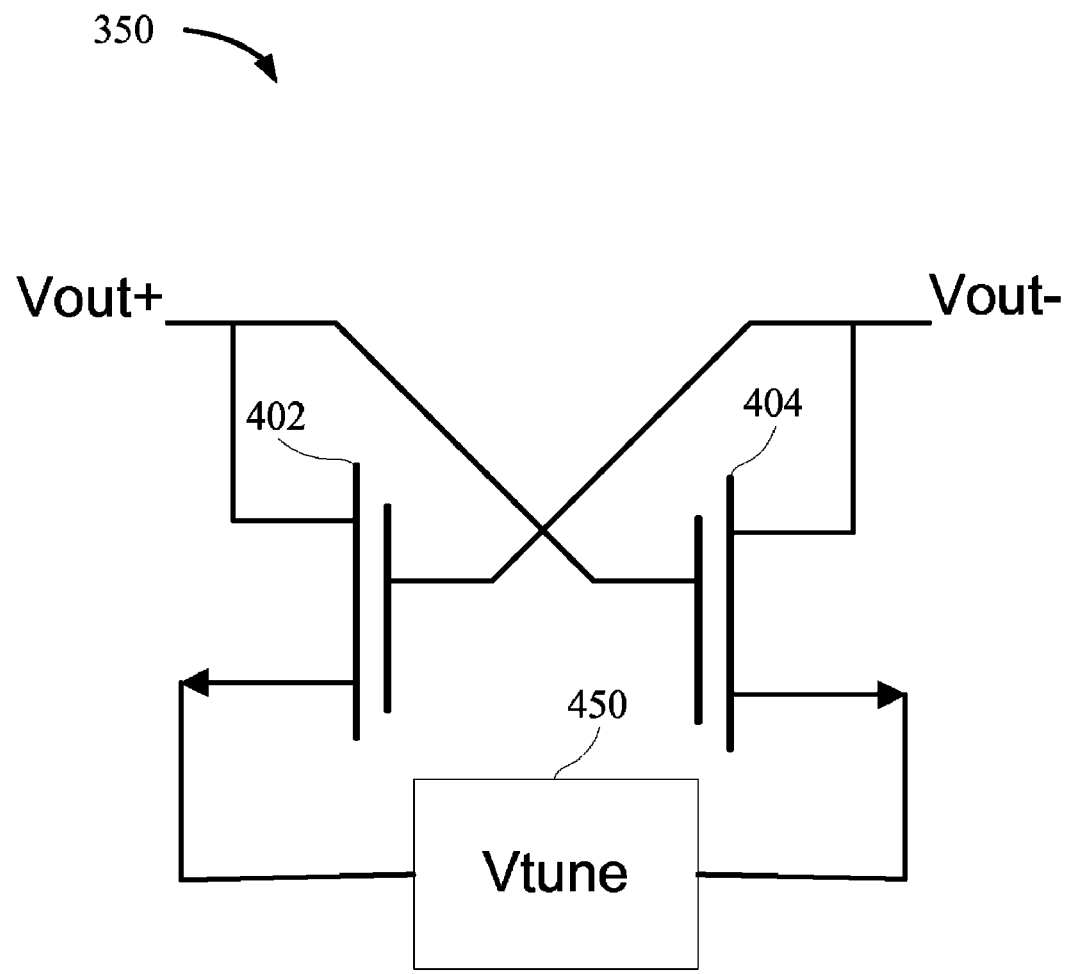
FIG. 4 illustrates an example negative resistance block according to an embodiment of the invention.

FIG. 4 illustrates an example negative resistance block 350 according to an embodiment of the invention.

As shown, negative resistance block 350 of FIG. 4 includes first and second transconductance (gm) devices 402 and 404 (e.g., NMOS transistors) cross-coupled to the output of LNA 300. That is, gm device 402 is coupled at a first terminal (e.g., drain) to the positive output Vout+ of LNA 300, and is coupled at a second terminal (e.g., gate) to the negative output Vout− of LNA 300. In contrast, gm device 404 is coupled at a first terminal (e.g., drain) to the negative output Vout− of LNA 300, and is coupled at a second terminal (e.g., gate) to the positive output Vout+ of LNA 300. Negative resistance block 350 of FIG. 4 further includes a tuning voltage source Vtune 450 coupled to a third terminal (e.g., source) of each gm device 402 and 404. Vtune 450 is configurable to provide a desired voltage level and will be described in more detail below.

The negative resistance block 350 implementation of FIG. 4 is one of a class of negative resistance circuits referred to as negative gm circuits. In general, negative gm circuits provide a negative resistance −Rneg inversely proportional to the transconductance of one or more included active devices, the transconductance being based on biasing conditions of the circuit. For example, the magnitude of the negative resistance |Rneg| of the negative gm circuit of FIG. 4 is equal to 2/gm, where gm is here the transconductance of each of the gm devices 402 and 404. Vtune 450 can be adjusted by biasing gm devices 402 and 404 to a desired level, thereby shifting the voltage drop from the second terminal to the third terminal (e.g., Vgate—Vsource) of each gm device 402 and 404, which determines the transconductance of each. Thus, gm can be set to an arbitrary desired value, and hence, Rneg can be adjusted as desired according to application specific system requirements, etc.

Figure 5:
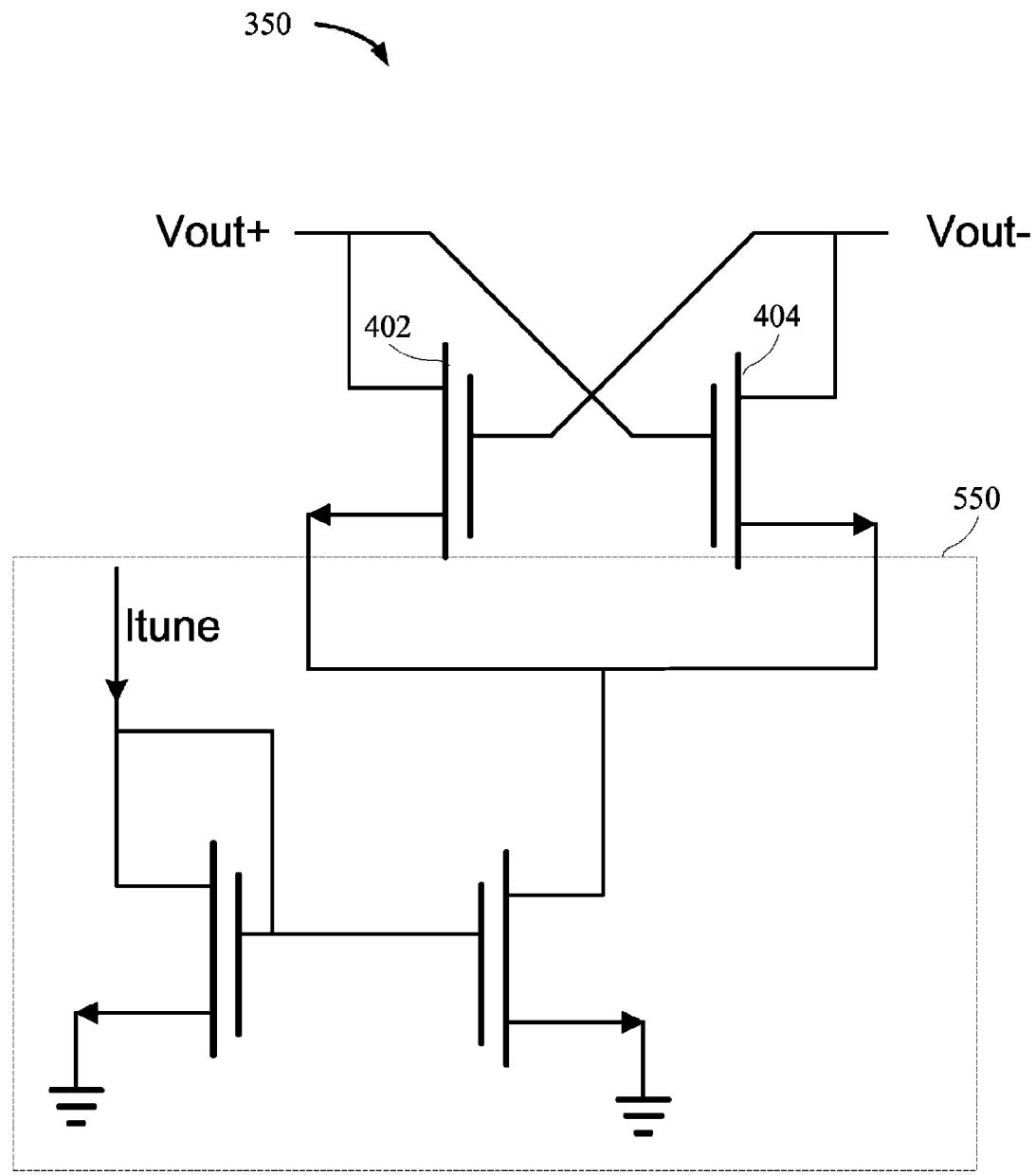
FIG. 5 illustrates an example negative resistance block according to another embodiment of the invention.

FIG. 5 illustrates an example negative resistance block 350 according to another embodiment of the invention.

As shown, negative resistance block 350 of FIG. 5 includes first and second gm devices 402 and 404 (e.g., NMOS transistors) cross-coupled to the output of LNA 300, as described above with reference to FIG. 4. Negative resistance block 350 of FIG. 5 further includes a tuning current source 550 coupled to a third terminal (e.g., source) of each gm device 402 and 404. Tuning current source 550 is illustrated as a current mirror receiving a tuning current Itune and providing a mirrored current to bias gm devices 402 and 404. Itune may be, for example, a programmable current source, which is well known in the art, and may be provided by circuitry external to LNA 300 (not shown).

The negative resistance block 350 design of FIG. 5 is also considered a negative gm circuit, and the magnitude of the negative resistance |Rneg| of the negative gm circuit 350 of FIG. 5 is also inversely proportional to its transconductance. Similar to Vtune of FIG. 4, Itune controls the transconductance of the negative gm circuit, and hence, the value of the negative resistance −Rneg.

The design of FIG. 5 provides a simple, low noise negative gm circuit where the transconductance is controlled by a bias current Itune. However, one of the drawbacks of this design is that the amount of negative resistance is essentially fixed by the external bias current Itune. Another drawback is the introduction of additional nonlinearities. Accordingly, this design may be appropriate for applications that require lower complexity circuits (to conserve space, etc.), while being tolerant of limited linearity.

Figure 6:
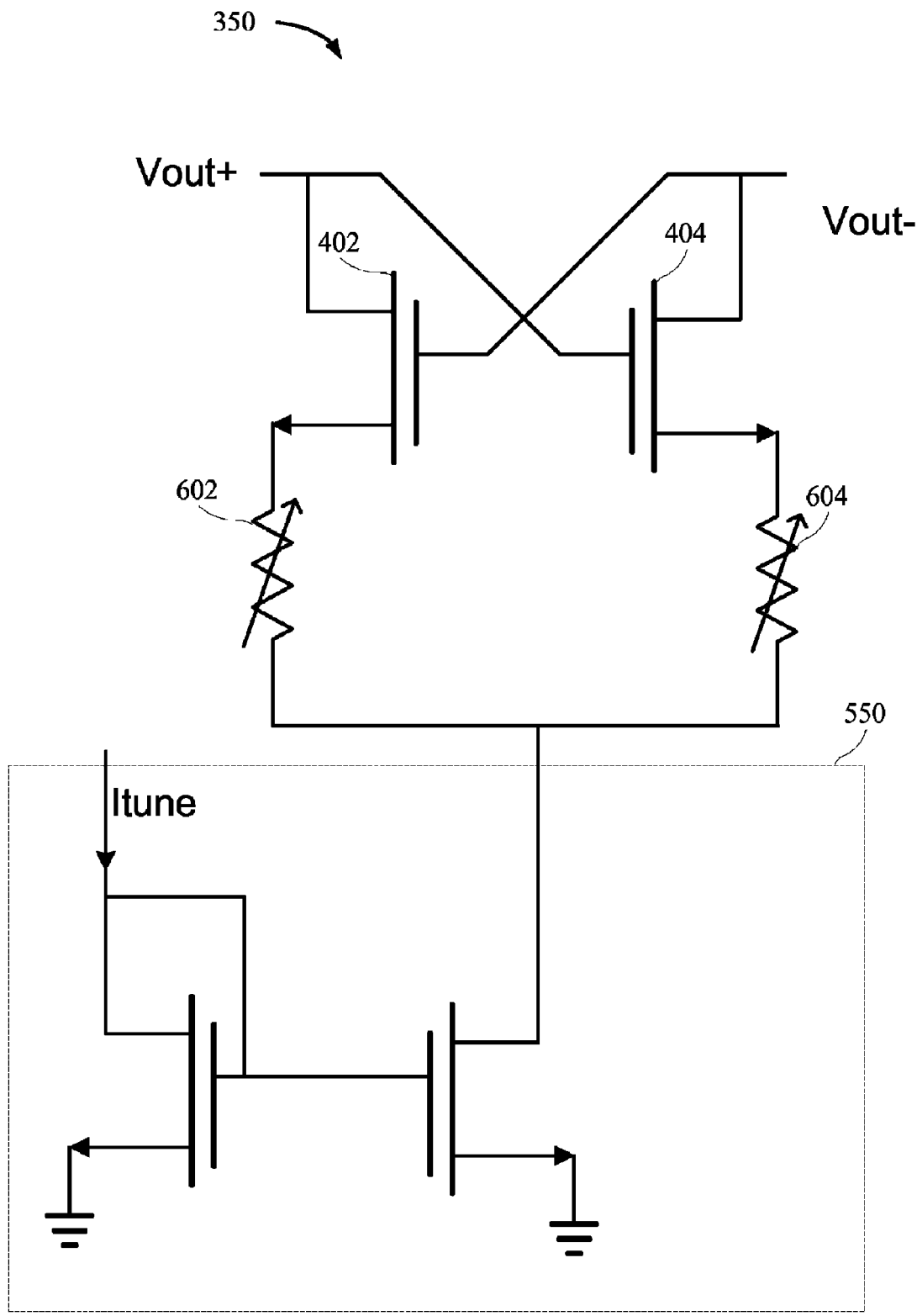
FIG. 6 illustrates an example negative resistance block according to another embodiment of the invention.

FIG. 6 illustrates an example negative resistance block 350 according to another embodiment of the invention.

As shown, negative resistance block 350 of FIG. 6 includes first and second gm devices 402 and 404 (e.g., NMOS transistors) cross-coupled to the output of LNA 300, as described above with reference to FIG. 4, as well as a tuning current source 550 coupled to a third terminal (e.g., source) of each gm device 402 and 404, as described above with reference to FIG. 5. In addition, negative resistance block 350 of FIG. 6 further includes variable resistors 602 and 604 coupled between the third terminals of the gm devices 402 and 404, respectively, and tuning current source 550.

The negative resistance block 350 design of FIG. 5 is also considered a negative gm circuit, and the magnitude of the negative resistance |Rneg| of the negative gm circuit 350 of FIG. 6 is also inversely proportional to its transconductance. Similar to FIG. 5, Itune controls the transconductance of the negative gm circuit, and hence, the value of the negative resistance –Rneg. However, because gm devices 402 and 404 are each resistively coupled to the tuning current source 550 in the design of FIG. 6, the transconductance of each gm device 402 and 404 can be further tuned to provide a negative resistance as desired by adjusting the resistance values of variable resistors 602 and 604 to control biasing. Unlike the design of FIG. 5, the design of FIG. 6 provides negative resistance tuning beyond that of the externally provided tuning current Itune alone.

Accordingly, the design of FIG. 6 provides additional tunability as compared to the design of FIG. 5, and also allows a designer to trade-off linearity for a desired amount of negative resistance –Rneg. However, one of the drawbacks of this design is that the added resistance of variable resistors 602 and 604 requires a higher current for proper functionality, as well as additional headroom in the IC. Thus, this design may be appropriate for applications that require more flexibility while being able to accommodate additional complexity.

Figure 7:
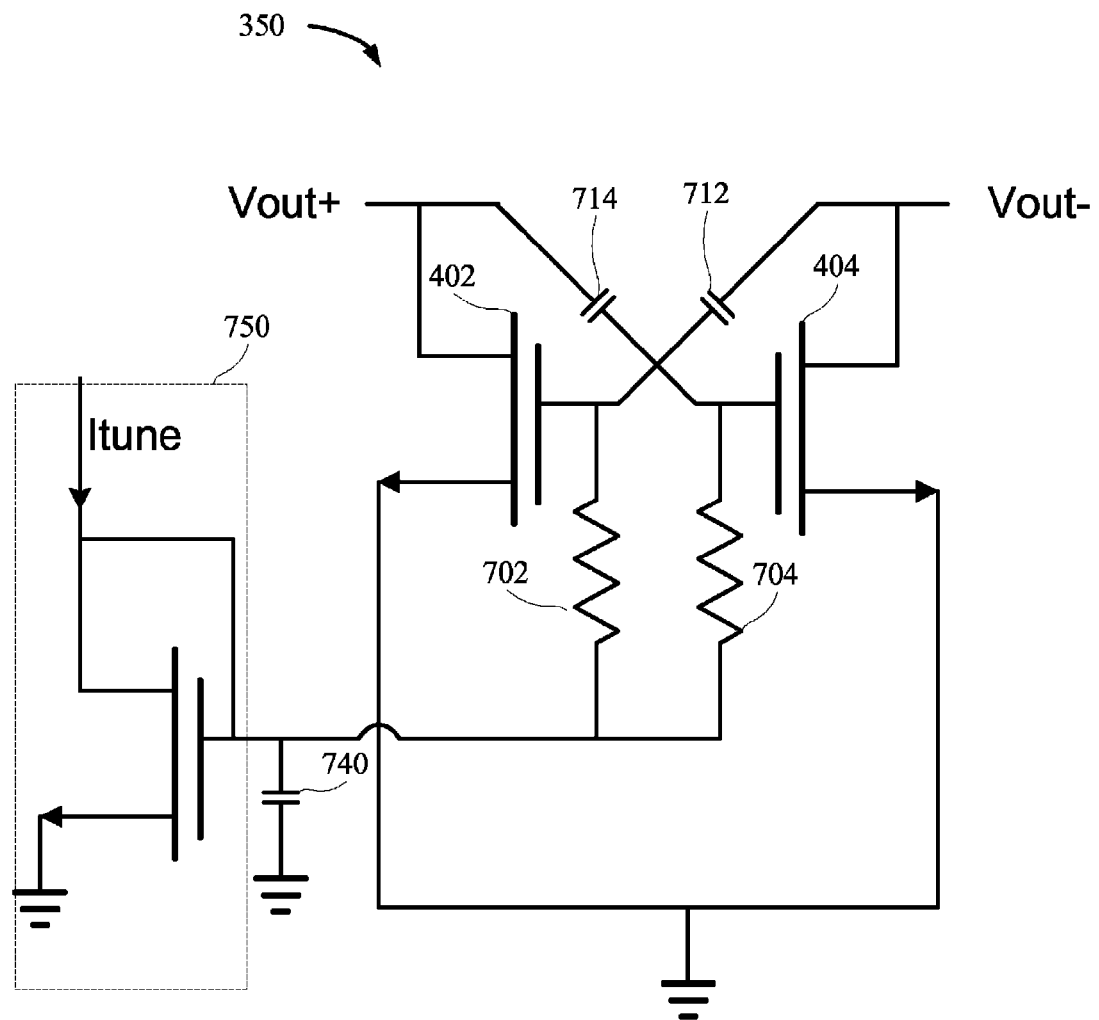
FIG. 7 illustrates an example negative resistance block according to another embodiment of the invention.

FIG. 7 illustrates an example negative resistance block 350 according to another embodiment of the invention.

As shown, negative resistance block 350 of FIG. 7 includes first and second gm devices 402 and 404 (e.g., NMOS transistors) cross-coupled to the output of LNA 300, as described substantially above with reference to FIG. 4. However, unlike the previous designs of FIGS. 4-6, gm device 402 is capacitively coupled (also referred to as AC coupling) at its second terminal (e.g., gate) to the negative output Vout– of LNA 300 via a first capacitor 712, and gm device 404 is capacitively coupled at its second terminal (e.g., gate) to the positive output Vout+ of LNA 300 via a second capacitor 714. Further, unlike previous designs of FIGS. 5 and 6, negative resistance block 350 of FIG. 7 includes a tuning current source 750 resistively coupled to the second terminal (e.g., gate) of each gm device 402 and 404 via resistors 702 and 704, respectively. In this design, the second terminals of gm devices 402 and 404 (e.g., gate) are also capacitively coupled to ground via a third capacitor 740, and the third terminals of gm devices 402 and 404 (e.g., source) are coupled directly to ground.

The negative resistance block 350 design of FIG. 7 is also considered a negative gm circuit, and the magnitude of the negative resistance |Rneg| of the negative gm circuit of FIG. 7 is also inversely proportional to its transconductance. However, this design allows more design control than the design of FIG. 6 because capacitive coupling allows the gate and drain of gm devices 402 and 404 to be DC biased at different voltages.

Accordingly, the design of FIG. 7 provides good linearity and low noise while allowing a designer to more accurately set the desired amount of negative resistance –Rneg. However, one of the drawbacks of this design is the introduction of parasitic capacitance from the coupling capacitors 702 and 704. Thus, this design may be appropriate for applications that require more precise tuning while being able to effectively handle unwanted parasitic effects.

Figure 8:
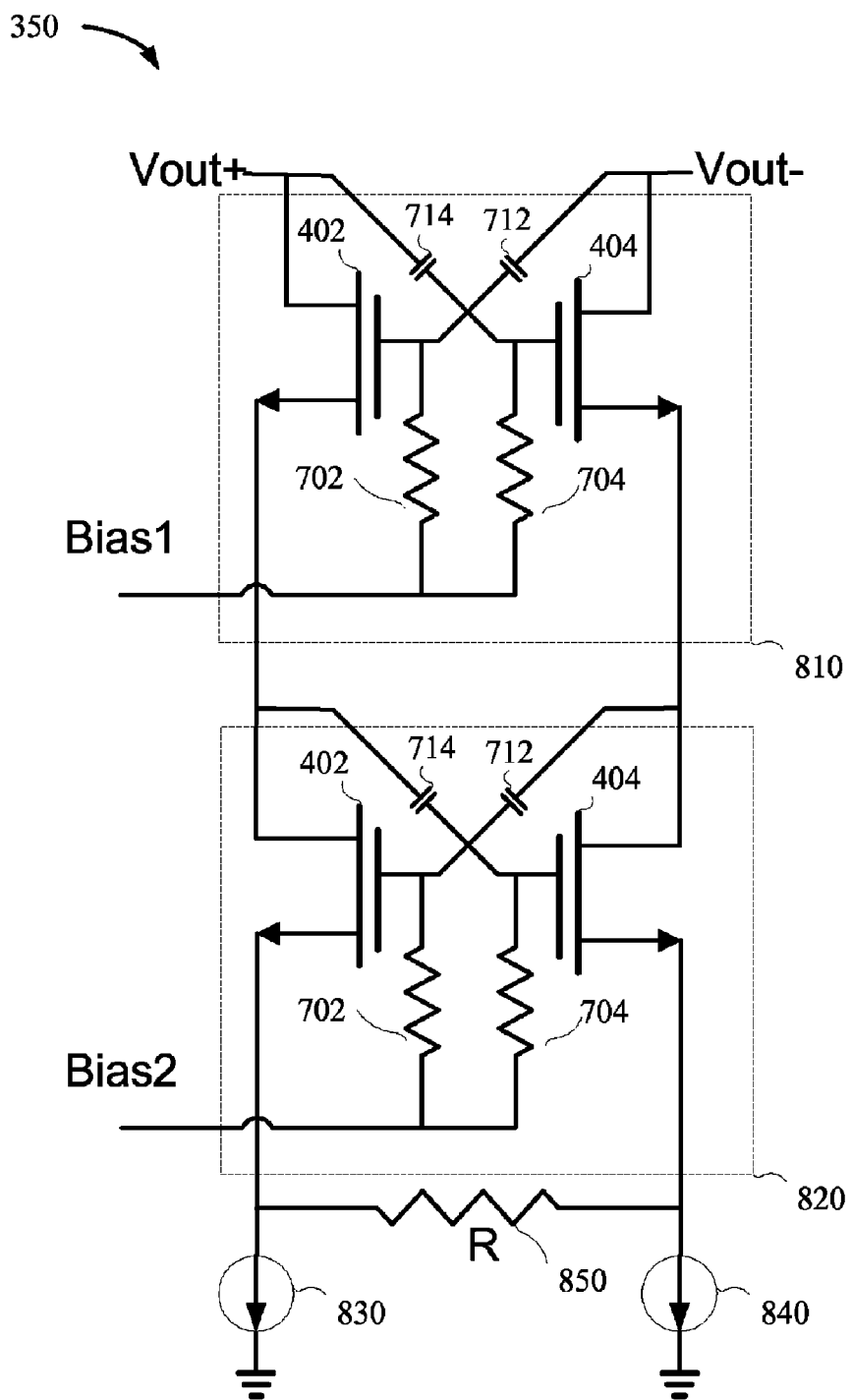
FIG. 8 illustrates an example negative resistance block according to another embodiment of the invention.

FIG. 8 illustrates an example negative resistance block 350 according to another embodiment of the invention.

As shown, negative resistance block 350 of FIG. 8 includes first and second negative gm stages 810 and 820, which are each substantially similar to the negative gm circuit of FIG. 7. Specifically, each negative gm stage 810 and 820 includes first and second gm devices 402 and 404 (e.g., NMOS transistors) cross-coupled to the output of LNA 300, as described above with reference to FIG. 4, a first AC coupling capacitor 712 coupling gm device 402 at its second terminal (e.g., gate) to the negative output Vout– of LNA 300, a second coupling capacitor 714 coupling gm device 404 at its second terminal (e.g., gate) to the positive output Vout+ of LNA 300, and resistors 702 and 704 resistively coupling the second terminal (e.g., gate) of each gm device 402 and 404, respectively, to a biasing current (not shown). The first negative gm stage 810 is cross-coupled to the output of LNA 300 as described above with reference to FIG. 4, whereas the second negative gm stage 820 is cross-coupled to the output of the first negative gm stage 810 at the first stage's third terminals (e.g., drain) of gm devices 402 and 404 in the same manner. In addition to the first and second negative gm stages 810 and 820, negative resistance block 350 of FIG. 8 further includes two current sources 830 and 840 coupled to the outputs of the second negative gm stage 820 at the second stage's third terminals (e.g., drain) of gm devices 402 and 404, and a resistor R 850 coupled across the output of the second negative gm stage 820.

The negative resistance block 350 design of FIG. 7 is considered a translinear negative resistance circuit where the magnitude of the negative resistance |Rneg| is equal to the resistance of resistor R 850. This design provides good linearity and the AC coupling biasing of the circuit allows sufficient headroom. However, the additional circuit complexity introduces noise and requires more current to operate. Thus, this design may be appropriate for applications that require more linearity while being able to accommodate additional complexity and current requirements.

The forgoing FIGS. 4-8 each illustrate negative resistance blocks as externally biased, tuning based negative resistance circuits. However, negative resistance block 350 is not limited to only these types of negative resistance circuits, and may be implemented as any suitable negative resistance device, circuit, or system. For example, negative resistance block 350 may alternatively be implemented as a double current mirror with a variable output resistor, as will be discussed in more detail below.

Figure 9:
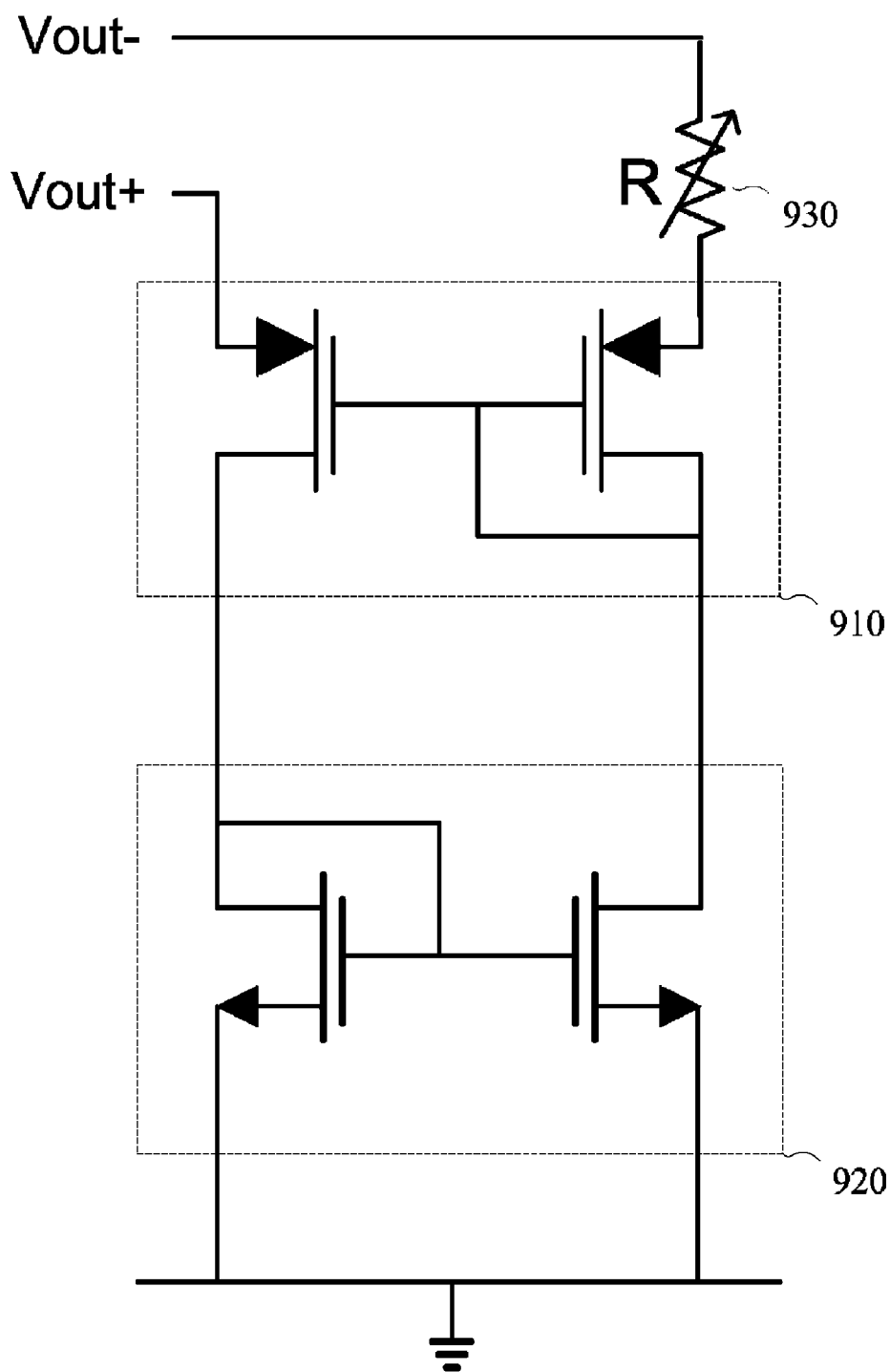
FIG. 9 illustrates an example negative resistance block according to another embodiment of the invention.

FIG. 9 illustrates an example negative resistance block 350 according to another embodiment of the invention.

As shown, negative resistance block 350 of FIG. 9 includes first and second current mirrors 910 and 920. The first current mirror 910 is coupled to the output of LNA 300 via first terminals (e.g., drain) of its gm devices (e.g., NMOS transistors), and coupled to the second current mirror 920 via the first current mirrors third terminals (e.g., source) and the second current mirrors first terminals (e.g., drain). Negative resistance block 350 of FIG. 9 further includes an output variable resistor R 930, which is equal in magnitude to the negative resistance |Rneg| provided by this circuit. Thus, the variable resistor R 930 can be adjusted to provide a desired resistance. In this design, current mirrors 910 and 920 have relatively high transconductances, which maintains adequate accuracy, but may require more current to operate. It will be appreciated that this design can be used to provide negative resistance in not only differential circuit applications, but also single-ended applications as well.

The designs of the forgoing figures provide variable linearity and noise performance. The linearity of a circuit can be characterized by the input-referred third-order intercept point (IIP3). The IIP3 is a theoretical point where the desired output RF signal and the third-order products become equal in amplitude. The IIP3 is an extrapolated value since the active device goes into compression before the IIP3 point is reached. As discussed briefly in the background section, the noise of a circuit can be characterized by the noise figure (NF). The NF measures degradation of the signal-to-noise-ratio (SNR) caused by components in the RF signal chain.

Table 1 provides example simulation data comparing IIP3 and NF across several selected designs for illustration purposes. The data in table 1 is represented as differences from a conventional LNA design without added negative resistance (e.g., the design of FIG. 3).

TABLE 1

| Design | IIP3 (dBm) | NF (dB) |
|---|---|---|
| FIG. 5 | −8 | +0.08 |
| FIG. 6 | −4 | +0.13 |
| FIG. 7 | −4 | +0.08 |
| FIG. 8 | −3 | +0.20 |

Figure 10:
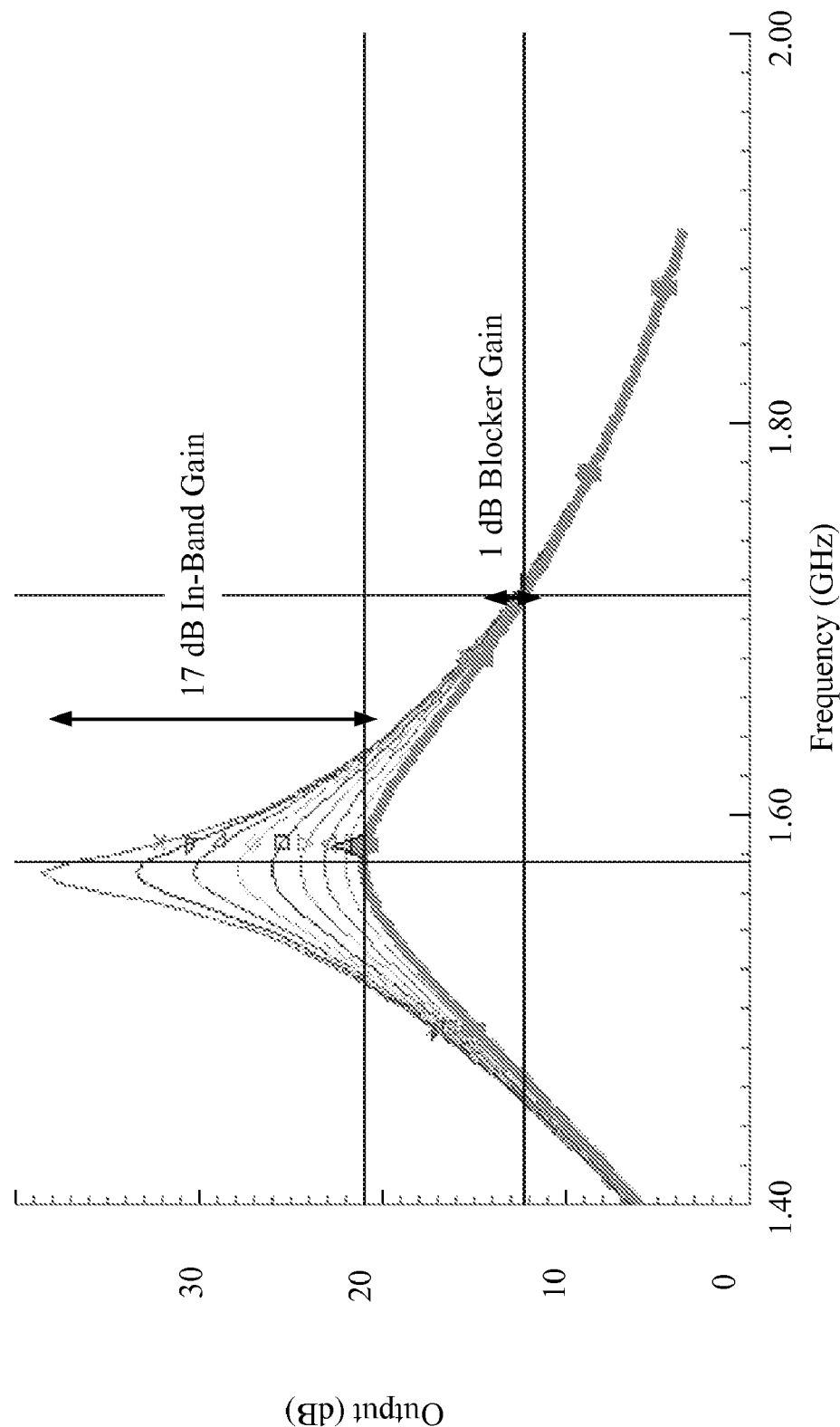
FIG. 10 is a graph illustrating the signal rejection in the presence of strong interference signals using a negative resistance block according to various embodiments of the invention.

FIG. 10 is a graph illustrating the signal rejection in the presence of strong interference signals using a negative resistance block according to various embodiments of the invention.

Simulation data is shown for an example receiver operating at approximately 1575 MHz (e.g., GPS receiver) and an example strong blocker operating around 1700 MHz (e.g., CDMA wireless communication system), where the rejection of the receiver has been enhanced according to the techniques presented herein. Rejection enhancement from negative resistance values in an example range of −1000 ohms to −5000 ohms are illustrated. It will be appreciated that this example range is provided for illustration purposes only, and the techniques presented herein are applicable to a wide range of any amount of negative resistance depending on application specific design requirements. As shown, an approximately 17 dB additional in-band gain is achieved for the desired signal for the smallest value of negative resistance illustrated, whereas only about a 1 dB additional gain is resultant at the blocker frequency. Thus, FIG. 10 illustrates that a significant improvement in selectivity of a receiver in the presence of strong interference signals can be attained by using a negative resistance block according to the various embodiments of the invention.

Figure 11:
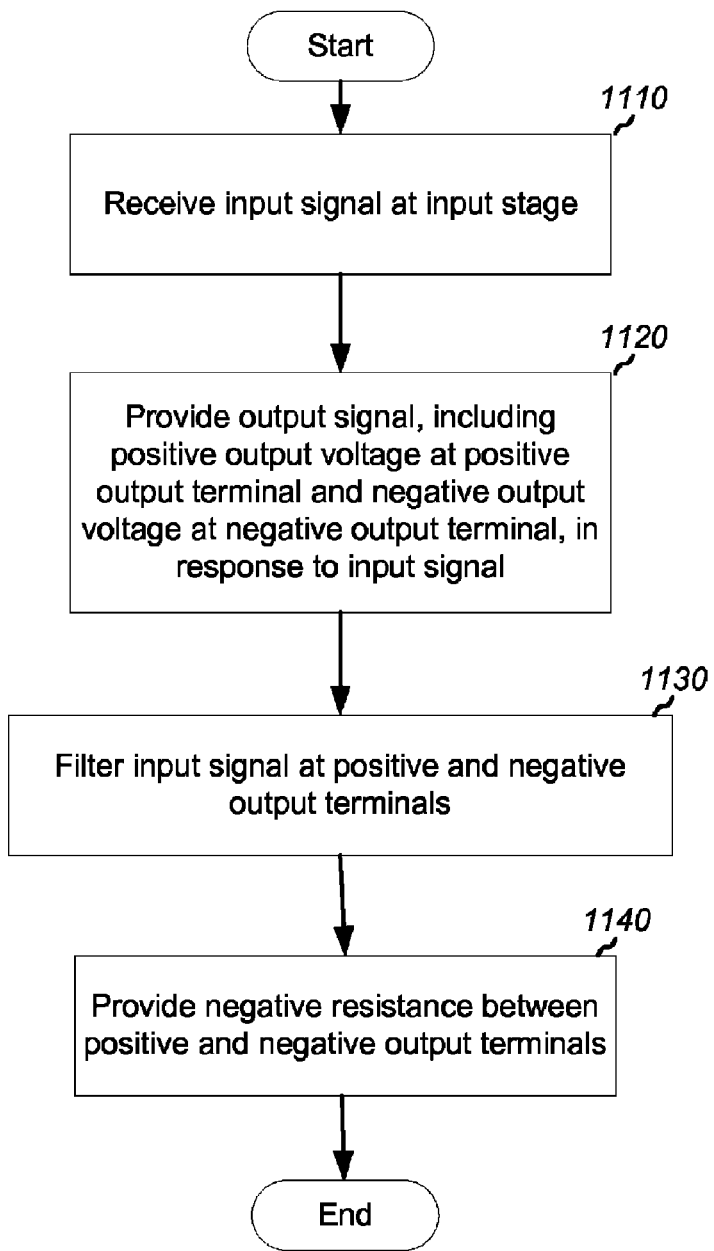
FIG. 11 is a flow diagram illustrating a method for amplifying received signals according to an embodiment of the invention.

In view of the foregoing, it will be appreciated that embodiments of the invention can include methods for performing the functions, sequence of actions and/or algorithms described herein. For example, FIG. 11 is a flow diagram illustrating a method for amplifying received signals according to an embodiment of the invention. As shown, the method may include receiving an input signal at an input stage (block 1110), providing an output signal, including a positive output voltage at a positive output terminal and a negative output voltage at a negative output terminal, in response to the input signal (block 1120), filtering the input signal at the positive and negative output terminals (block 1130), and providing a negative resistance between the positive and negative output terminals (block 1140).

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising an amplifier, wherein the amplifier comprises:
    an output stage formed of a positive output terminal providing a positive output voltage and a negative output terminal providing a negative output voltage;
    a load tank coupled in parallel with the output stage and configured to filter signals received at the amplifier; and
    a negative resistance block coupled in parallel with the output stage and the load tank and having a tunable negative resistance.

2. The apparatus of claim 1, wherein the negative resistance block is a negative transconductance circuit configured to provide a negative resistance based on biasing conditions of one or more active devices included in the circuit.

3. The apparatus of claim 1, wherein the negative resistance block comprises:
    a first transconductance device with a first terminal coupled to the positive output terminal of the output stage and a second terminal coupled to the negative output terminal of the output stage; and
    a second transconductance device with a first terminal coupled to the negative output terminal of the output stage and a second terminal coupled to the positive output terminal of the output stage.

4. The apparatus of claim 3, wherein the negative resistance block further comprises:
    a tuning voltage source coupled to a third terminal of the first transconductance device and coupled to a third terminal of the second transconductance device, the tuning voltage source being configured to provide a biasing voltage to the first and second transconductance devices.

5. The apparatus of claim 3, wherein the negative resistance block further comprises:

a tuning current source coupled to a third terminal of the first transconductance device and coupled to a third terminal of the second transconductance device, the tuning current source being configured to provide a biasing current to the first and second transconductance devices.

6. The apparatus of claim 5, wherein the tuning current source is a current mirror receiving an external tuning current and providing a mirrored current.

7. The apparatus of claim 5, wherein the third terminals of the first and second transconductance devices are each resistively coupled to the tuning current source to provide desired biasing of the first and second transconductance devices.

8. The apparatus of claim 3, wherein
the second terminals of the first and second transconductance devices are capacitively coupled to the negative output terminal of the output stage and the positive output terminal of the output stage, respectively, and
the second terminals of the first and second transconductance devices are each resistively coupled to a tuning current source.

9. The apparatus of claim 8, wherein
the second terminals of the first and second transconductance devices are capacitively coupled to ground, and
third terminals of the first and second transconductance devices are coupled to ground.

10. The apparatus of claim 8, wherein the negative resistance block further comprises:
a third transconductance device with a first terminal coupled to a third terminal of the first transconductance device, a second terminal capacitively coupled to a third terminal of the second transconductance device, and a third terminal coupled to a first tuning current source;
a fourth transconductance device with a first terminal coupled to the third terminal of the second transconductance device, a second terminal capacitively coupled to the third terminal of the first transconductance device, and a third terminal coupled to a second tuning current source; and
a resistor coupled to the third terminals of the third and fourth transconductance devices.

11. The apparatus of claim 3, wherein the transconductance devices are NMOS transistors, including a first terminal as a source of the transistor, a second terminal as a gate of the transistor, and a third terminal as a drain of the transistor.

12. The apparatus of claim 1, wherein the negative resistance block comprises:
first and second current mirrors coupled to each other, wherein the first current mirror is coupled to the positive output terminal of the output stage at one terminal and resistively coupled to the negative output terminal of the output stage at another terminal.

13. The apparatus of claim 1, wherein the negative resistance block provides a negative resistance in the range −1000 ohms to −5000 ohms, inclusive.

14. The apparatus of claim 1, wherein the load tank is formed of a load inductor and a load capacitor.

15. The apparatus of claim 1, further comprising:
a pair of cascode devices coupled to the output stage and configured to buffer current in the amplifier.

16. The apparatus of claim 1, the amplifier further comprising:
a transconductance stage configured to receive an input voltage; and
a current source configured to provide current to the transconductance stage.

17. The apparatus of claim 1, wherein the apparatus is a low noise amplifier (LNA).

18. The apparatus of claim 1, wherein the apparatus is a wireless receiver.

19. The apparatus of claim 1, wherein the apparatus is a GPS receiver.

20. A method of amplifying a signal, the method comprising:
receiving an input signal at an input stage;
providing an output signal, including a positive output voltage at a positive output terminal and a negative output voltage at a negative output terminal, in response to the input signal;
filtering the input signal at the positive and negative output terminals; and
providing a tunable negative resistance between the positive and negative output terminals.

21. The method of claim 20, wherein providing the negative resistance comprises:
passing current through one or more active devices, wherein the negative resistance is based on a transconductance of the one or more active devices.

22. The method of claim 21, wherein providing the negative resistance further comprises:
biasing the one or more active devices to set the transconductance to a desired value.

23. The method of claim 20, wherein the provided negative resistance is in the range of −1000 ohms to −5000 ohms, inclusive.

24. An amplifier, comprising:
means for receiving an input signal;
means for providing an output signal, including a positive output voltage at a positive output terminal and a negative output voltage at a negative output terminal, in response to the input signal;
means for filtering the input signal at the positive and negative output terminals; and
means for providing a tunable negative resistance between the positive and negative output terminals.

25. The amplifier of claim 24, wherein the means for providing the negative resistance comprises:
transconductance means for passing current, wherein the negative resistance is based on a transconductance of the transconductance means.

26. The amplifier of claim 25, wherein the means for providing the negative resistance further comprises:
means for biasing the transconductance means to set the transconductance to a desired value.

27. The amplifier of claim 24, wherein the provided negative resistance is in the range of −1000 ohms to −5000 ohms, inclusive.

* * * * *